United States Patent
Moriya et al.

(10) Patent No.: US 6,872,636 B2
(45) Date of Patent: Mar. 29, 2005

(54) METHOD FOR FABRICATING A SEMICONDUCTOR DEVICE

(75) Inventors: Atsushi Moriya, Tokyo (JP); Yasuhiro Inokuchi, Tokyo (JP); Takaaki Noda, Tokyo (JP); Yasuo Kunii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/100,922

(22) Filed: Mar. 20, 2002

(65) Prior Publication Data

US 2002/0168866 A1 Nov. 14, 2002

(30) Foreign Application Priority Data

Mar. 21, 2001 (JP) .................................... 2001-079740

(51) Int. Cl.[7] ............................................. H01L 21/00
(52) U.S. Cl. ...................... 438/479; 438/481; 117/105
(58) Field of Search ............................... 438/479–509, 438/745; 117/84–109; 427/481, 567, 586, 74, 99

(56) References Cited

U.S. PATENT DOCUMENTS

| | | | | | |
|---|---|---|---|---|---|
| 4,357,179 | A | * | 11/1982 | Adams et al. | 430/135 |
| 4,699,805 | A | * | 10/1987 | Seelbach et al. | 427/91 |
| 4,824,697 | A | * | 4/1989 | Ishihara et al. | |
| 5,864,161 | A | * | 1/1999 | Mitani et al. | 257/347 |
| 6,329,274 | B1 | * | 12/2001 | Inoue et al. | |
| 6,635,556 | B1 | * | 10/2003 | Herner et al. | 438/488 |
| 2003/0119288 | A1 | * | 6/2003 | Yamazaki et al. | 438/565 |

* cited by examiner

Primary Examiner—Savitri Mulpuri
(74) Attorney, Agent, or Firm—Bacon & Thomas PLLC

(57) ABSTRACT

A semiconductor device fabricating method includes the step of supplying $BCl_3$ as a doping gas, $SiH_4$ as a film forming gas, and $H_2$ as a carrier gas to a reaction chamber of a semiconductor device fabricating apparatus, wherein $SiH_4$, $BCl_3$ and $H_2$ flow in the reaction chamber on the condition that the film forming pressure ranges from about 0.1 to 100 Pa and the film forming temperature ranges from about 400 to 700° C.

10 Claims, 5 Drawing Sheets

METHOD FOR FABRICATING A SEMICONDUCTOR DEVICE

FIELD OF THE INVENTION

The present invention relates to a semiconductor device fabricating method for forming a Si epitaxial growth films or a SiGe epitaxial growth films on a silicon substrate such as a Si wafer by using a vertical type or a horizontal type low pressure CVD(chemical vapor deposition) apparatus.

BACKGROUND OF THE INVENTION

Referring to FIG. 1, there is shown a schematic cross sectional view of a reaction chamber 40 of a vertical type low pressure CVD apparatus, into which a standard boat 5 mounting therein a plurality of stacked Si wafers 8 is loaded, for use in forming Si or SiGe epitaxial growth films on the Si wafers 8. Further, there are shown in FIGS. 2A and 2B, a top cross sectional view of the standard boat 5 in FIG. 1 and a partial front cross sectional view thereof, respectively.

As shown in FIG. 1, the reaction chamber 40 includes a base portion 1 at its lower part, a gas supply port 2 installed at the base portion 1, and an outer tube 3 and an inner tube 4 at the upper part of the base portion 1, the inner tube 4 being located at inside the outer tube 3. The base portion 1 is further provided with an exhaust port 7 in such a manner that the exhaust port 7 communicates with the space provided between the outer tube 3 and the inner tube 4. The standard boat 5 is loaded in the inner tube 4.

The standard boat 5 has, e.g., four vertically arranged support rods 6 as shown in FIG. 2A. The support rods 6 have a plurality of wafer mount grooves 9 for horizontally holding a number of Si wafers 8 with an identical gap therebetween as shown in FIG. 2B.

In such a vertical type low pressure CVD apparatus, the Si or the SiGe epitaxial growth films are formed on the Si wafers 8 by supplying and exhausting the film forming gas, e.g., $SiH_4$ or $SiH_4$ and $GeH_4$, to and from the reaction chamber 40 via the gas supply port 2 and the exhaust port 7.

Boron(B) can be doped into the Si or the SiGe epitaxial growth films, by introducing a doping gas $B_2H_6$ into the reaction chamber 40 through the gas supply port 2, together with the film forming gas of $SiH_4$ or $SiH_4$ and $GeH_4$.

Since, however, the gas phase reaction of $B_2H_6$ is rather strong, $B_2H_6$ reacts not only with Si wafers 8 but also in other portions of the reaction chamber 40. Further, B is readily doped into the Si or the SiGe epitaxial growth films. This results in a great consumption rate of $B_2H_6$. Therefore, the respective Si wafers 8 located closer to the downstream side of the gas flow in the reaction chamber 40 tend to have lower concentrations of B in the Si or the SiGe epitaxial growth films formed thereon, resulting in the non-uniformity in the boron concentrations in the Si or the SiGe epitaxial growth films depending on the location of the Si wafers 8 in the reaction chamber 40. For this reason, it may become necessary to install in the reaction chamber 40 a number of gas supplement nozzles (not shown) for compensating for the rapid depletion of $B_2H_6$ gas. However, the increased number of gas supplement nozzles renders the vertical type low pressure CVD apparatus rather costly.

Further, when gaps between the Si wafers 8 mounted in the standard boat 5 are small, it is difficult for sufficient amounts of $B_2H_6$ to diffuse to the central portions of the respective Si wafers 8. This causes non-uniformity in the concentration of B even within a same Si wafer, exhibiting a concentration gradient of B in the Si or the SiGe epitaxial growth film lowering from the peripheral portion towards the central portion thereof.

For instance, when SiGe epitaxial growth films were grown on the Si wafers 8 by loading into the reaction chamber 40 the Si wafers 8 of a diameter of 200 mm mounted in the standard boat 5 with a gap of 5 mm therebetween and then introducing thereinto $B_2H_6$ as the doping gas, the sheet resistances, at the location of A to I shown in FIG. 3, of a SiGe epitaxial growth film formed on a Si wafer 8 were 1498 Ω/□, 2640 Ω/□, 2800 Ω/□, 2510 Ω/□, 1463 Ω/□, 1633 Ω/□, 2600 Ω/□, 2650 Ω/□, 2070 Ω/□ respectively, showing the variation of sheet resistances of ±30.3%. In general, when B is doped into the SiGe epitaxial growth film, the sheet resistances thereof become greater as the concentration of B in the SiGe epitaxial growth film becomes lower. Therefore, from the data described above, it is evident that the concentration of B is not uniform at the surface of a SiGe epitaxial film.

In order to solve the foregoing problems, it may be necessary to increase the gaps between the Si wafers 8 mounted in the standard boat 5. For example, when SiGe epitaxial growth films were grown on the Si wafers 8 by loading into the reaction chamber 40 the Si wafers 8 having a diameter of 200 mm mounted in the standard boat 5 with a gap of 10.5 mm therebetween and then introducing thereinto $B_2H_6$ as the doping gas, the sheet resistances, at the locations of A to I shown in FIG. 3, of the SiGe epitaxial growth film formed on a Si wafer 8 were 932 Ω/□, 1299 Ω/□, 1348 Ω/□, 1272 Ω/□, 879 Ω/□, 985 Ω/□, 1295 Ω/□, 1324 Ω/□, 1176 Ω/□ with the variation of the sheet resistances of ±20.1%. From this, it can be seen that, by increasing the gap between the Si wafers 8 loaded into the reaction chamber 40, the variation of the sheet resistances of the SiGe epitaxial growth films formed thereon decreases, and the uniformity of the concentration of B in the SiGe epitaxial growth films is improved.

However, when the gap between the Si wafers increases, the number of Si wafers on which the process of the film formation can be carried out at one time is reduced. For instance, when the gap between the Si wafers mounted in the standard boat become double, the number of Si wafers on which the process of the film formation can be carried out at one time is reduced to a half.

In such a standard boat 5, since $B_2H_6$ is also consumed at the support rods 6 thereof, the concentration of B becomes low in the Si or the SiGe epitaxial growth films at the portions of the Si wafers 8 close to the support rods 6, aggravating the uniformity of concentration of B in the growth films. In order to solve the afore mentioned problems, a ring boat having rings for separating the Si wafers 8 away from the support rods can be employed.

Referring to FIGS. 4A and 4B, there are shown a top cross sectional view and a partial front cross sectional view of a ring boat. As shown, the ring boat includes, e.g., four (see FIG. 4A) vertically arranged support rods 11. The support rods 11 are provided with a plurality of rings 12, each of rings 12 being provided with a plurality of, e.g., three, pins 13 for mounting one Si wafer 8 thereon.

In such a ring boat, since the distance between the support rods 11 and the periphery of Si wafers 8 is increased, it is possible to reduce the adverse effect of the support rods 11 against the uniformity of concentration of B in the Si or the SiGe epitaxial growth films formed on the Si wafers 8. For instance, when B doped SiGe epitaxial growth films were grown on the Si wafers 8 by loading into the reaction chamber 40 the Si wafers 8 having a diameter of 200 mm mounted with a gap of 11.5 mm therebetween and then introducing thereinto $B_2H_6$ as the doping gas, the sheet resistances, at the locations of A to I shown in FIG. 3, of the SiGe epitaxial growth film formed a Si wafer 8 were 266 Ω/□, 278 Ω/□, 287 Ω/□, 262 Ω/□, 236 Ω/□, 251 Ω/□, 266 Ω/□, 286 Ω/□, 308 Ω/□ with the variation of the sheet resistances of ±9.4%.

However, the price of the ring boats described above is considerably higher than that of the standard boats. Further, since the ring boat has a greater reaction area than the standard boat, the consumption rate of $B_2H_6$ increases. As a consequence, the adverse effect on the uniformity of B concentration depending on the relative locations of wafers with respect to the gas flow direction becomes worse in the case of ring boat, compared with that of standard boat, necessitating the installation of even a larger number of gas supplement nozzles in the CVD apparatus.

SUMMARY OF THE INVENTION

It is, therefore, an object of the present invention to provide a method for fabricating a semiconductor device, capable of forming Si or SiGe epitaxial growth films having a uniform concentration of B.

In accordance with a preferred embodiment of the present invention, there is provided a method for fabricating a semiconductor device by using a semiconductor fabricating apparatus incorporating therein a reaction chamber, the method including:

the step of supplying $BCl_3$ as a doping gas to the reaction chamber.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

Figure 1:
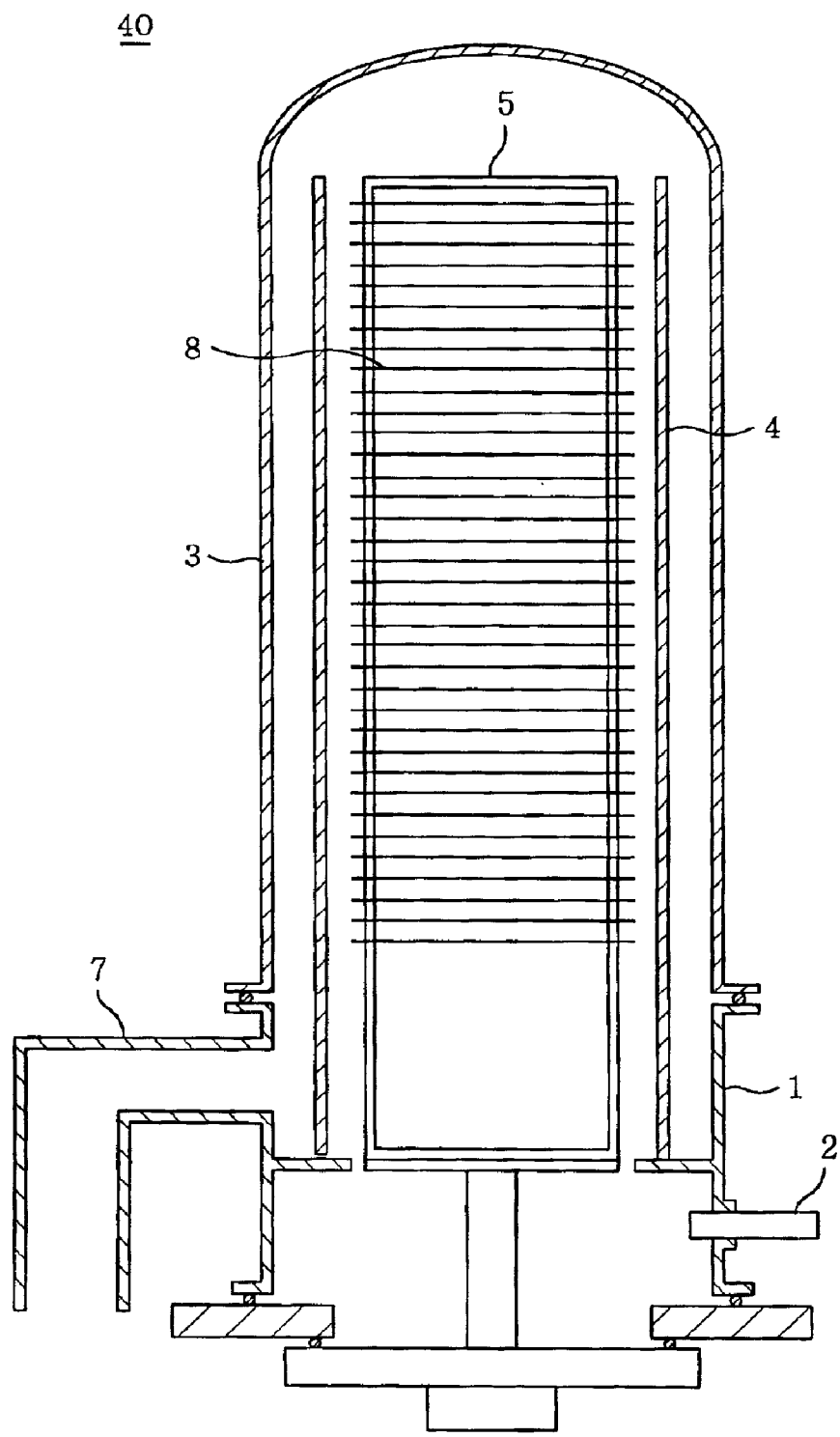
FIG. 1 shows a schematic cross sectional view of a reaction chamber of a vertical type low pressure CVD apparatus for use in manufacturing a semiconductor device in accordance with the present invention.

A method for fabricating a semiconductor device in accordance with the present invention will be described with reference to FIGS. 1 to 5. Like reference numerals in FIGS. 1 to 5 represent like parts.

Firstly, a method for forming Si epitaxial growth films on Si wafers will now be described in detail.

Figure 2A:
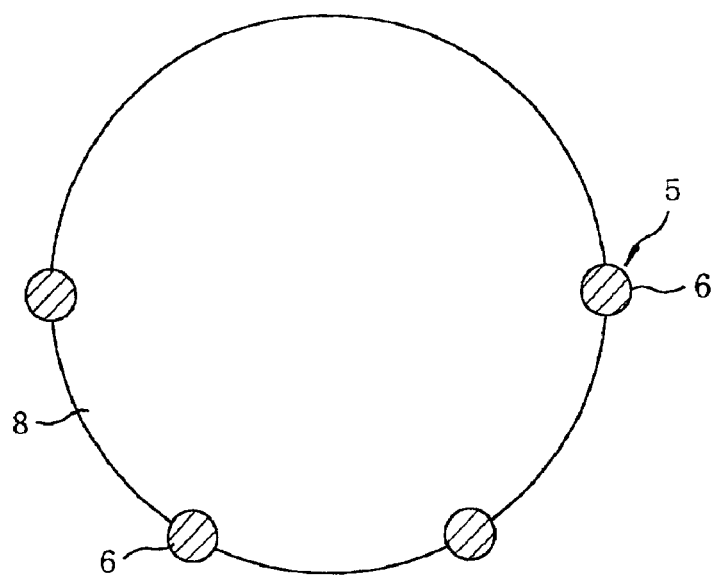
FIGS. 2A and 2B illustrate a top cross sectional view and a partial front cross sectional view of a standard boat shown in FIG. 1.
Figure 2B:
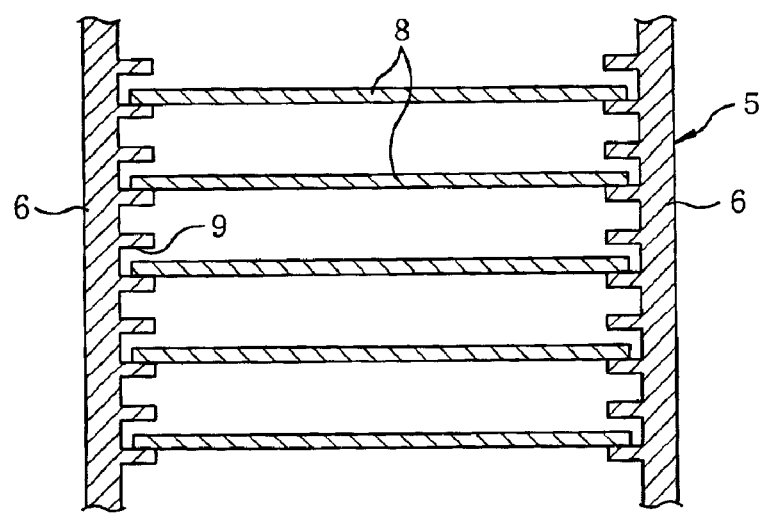
Figure 3:
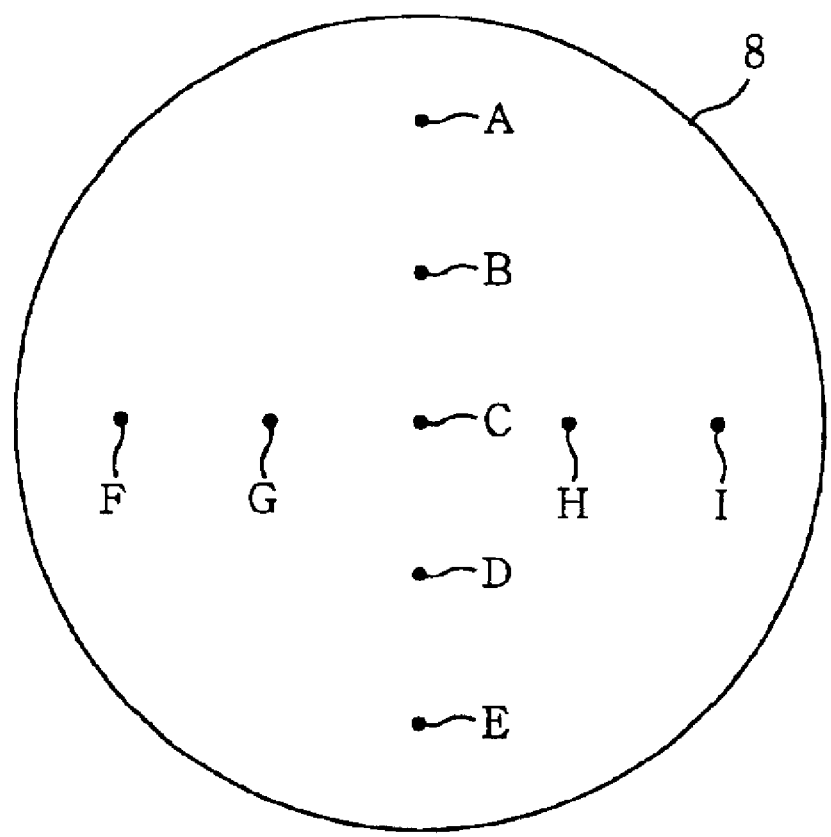
FIG. 3 depicts a view for setting forth measurement points of sheet resistance of a SiGe epitaxial growth film on a Si wafer.

As shown in FIGS. 2A and 2B, a plurality of Si wafers 8 is horizontally mounted and stacked in the standard boat 5, which is then, as shown in FIG. 1, loaded into the reaction chamber 40 of the vertical type low pressure CVD apparatus. Next, $SiH_4$ as the film formation gas, $BCl_3$ as the doping gas, and $H_2$ as a carrier gas are introduced into the reaction chamber 40 via the gas supply port 2 and then are exhausted therefrom via the exhaust port 7. In this case, $SiH_4$, $BCl_3$ and $H_2$ flow in the reaction chamber 40 on the condition that the film forming pressure is in a range from about 0.1 to 100 Pa, preferably from about 0.1 to 30 Pa, and more preferably from about 0.1 to 20 Pa, and the film forming temperature is in a range from about 400 to 700° C. and preferably from about 500 to 650° C. As a result, on the Si wafers 8 are formed Si epitaxial growth films into which B is doped.

Next, a method for forming SiGe epitaxial growth films on Si wafers will now be described in detail.

As shown in FIGS. 2A and 2B, a plurality of Si wafers 8 is horizontally mounted and stacked in the standard boat 5, which is then loaded into the reaction chamber 40 of the vertical type low pressure CVD apparatus as shown in FIG. 1. Subsequently, $SiH_4$ and $GeH_4$ as the film forming gas, $BCl_3$ as the doping gas, and $H_2$ as a carrier gas are introduced into the reaction chamber 40 via the gas supply port 2 and then are exhausted therefrom via the exhaust port 7. In this case, $SiH_4$, $GeH_4$, $BCl_3$ and $H_2$ flow in the reaction chamber 40 on the condition that the film forming pressure ranges from about 0.1 to 100 Pa, preferably from about 0.1 to 50 Pa, and more preferably from about 0.1 to 30 Pa, and the film forming temperature ranges from about 400 to 700° C. and preferably from about 450 to 600° C. As a result, on the Si wafers 8 are formed SiGe epitaxial growth films into which B is doped.

In such the semiconductor device fabricating methods, $BCl_3$ is supplied as the doping gas. In general, $BCl_3$ has a lower reactivity than $B_2H_6$ and when $BCl_3$ is supplied, B is doped into the Si or the SiGe epitaxial growth films at a rate proportional to the film growth rate. In the embodiments in accordance with the present invention, since the film forming pressure is low, e.g., in a range from about 0.1 to 100 Pa and also the film forming temperature is low, e.g., from about 400 and 700° C., the film growth rate of the Si or the SiGe epitaxial growth films is low. Accordingly, the doping rate of B into the Si or the SiGe epitaxial growth films is also low. For this reason, the consumption rate of $BCl_3$ is low and hence the number of gas supplement nozzles can be reduced. Consequently, the vertical type low pressure CVD apparatus can be less costly.

Additionally, even though the gap between the Si wafers 8 mounted in the standard boat 5 is reduced, the concentrations of B in the Si or the SiGe epitaxial growth films formed thereon can be uniform across the whole surface of each wafer. Accordingly, it is possible to reduce the gap between the Si wafers 8 mounted in the standard boat 5, and hence the number of Si wafers on which the process of the film formation can be carried out at one time increases.

Figure 4A:
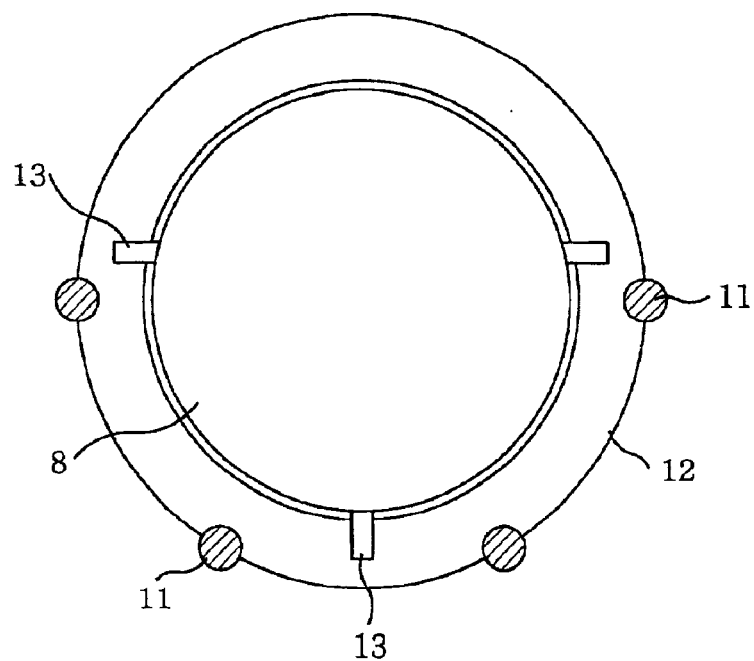
FIGS. 4A to 4B present a top cross sectional view and a partial front cross sectional view of a ring boat.
Figure 4B:
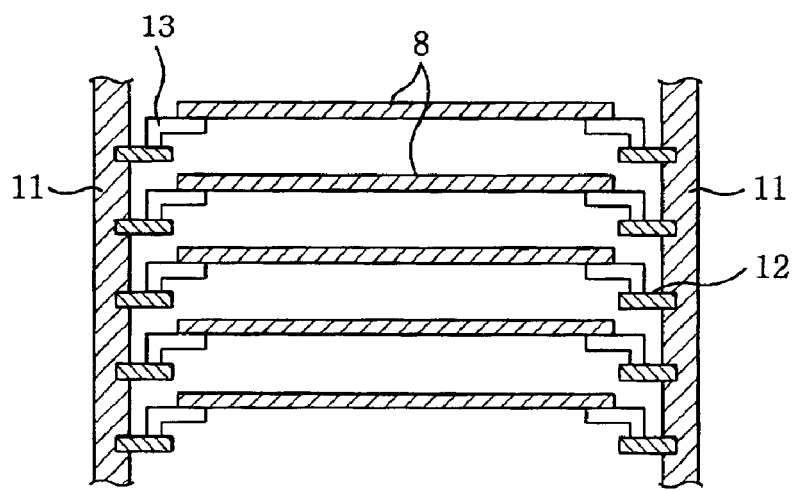

Further, since the standard boat 5 shown in FIG. 2 can be used in lieu of the costly ring boat having a greater reaction area shown in FIG. 4, the consumption rate of $BCl_3$ can become even smaller. As a result, there is a less possibility that, a Si wafer located closer to the downstream side of the gas flow in the reaction chamber has a lower concentration of B in the Si or the SiGe epitaxial growth film formed thereon. In other words, the Si or the SiGe epitaxial growth films formed on the Si wafers 8 can have a uniform concentration of B. For this reason, it is unnecessary to install a number of gas supplement nozzles in the reaction chamber 40.

First example in accordance with the present invention will now be described.

The standard boat 5 shown in FIGS. 2A and 2B, in which 50 Si wafers 8 having a diameter of 200 mm were mounted with a gap of 5 mm therebetween, was loaded into the reaction chamber 40. The film forming temperature was set to be about 500° C. and the film forming pressure was about 30 Pa and $SiH_4$ and $GeH_4$ as the film forming gas, $BCl_3$ as the doping gas, and $H_2$ as the carrier gas were supplied to the reaction chamber 40 so as to form B doped SiGe epitaxial growth films on the Si wafers 8, wherein the partial pressures thereof were 6.0 Pa, 0.3 Pa, $2.4 \times 10^{-3}$ Pa, 23.7 Pa, respectively. The sheet resistances, at the locations of A to I shown in FIG. 3, of the SiGe epitaxial growth films formed on a Si wafer 8 were 43.4 Ω/□, 44.8 Ω/□, 48.6 Ω/□, 44.3 Ω/□, 43.3 Ω/□, 43.2 Ω/□, 44.0 Ω/□, 44.4 Ω/□, 43.5 Ω/□ respectively with a variation of ±6.1%.

Second example in accordance with the present invention will now be described.

This example is similar to the first example excepting for a gap between the Si wafers 8. The gap between the Si wafers 8 of this example was set to be 10.5 mm. In this case, the sheet resistance of the SiGe epitaxial growth films formed on a Si wafer 8 were respectively 44.3 Ω/□, 44.0 Ω/□, 43.5 Ω/□, 43.4 Ω/□, 44.0 Ω/□, 45.8 Ω/□, 43.9 Ω/□, 43.8 Ω/□, 44.8 Ω/□, at the locations of A to I shown in FIG. 3, with a variation of ±2.7%.

Figure 5:
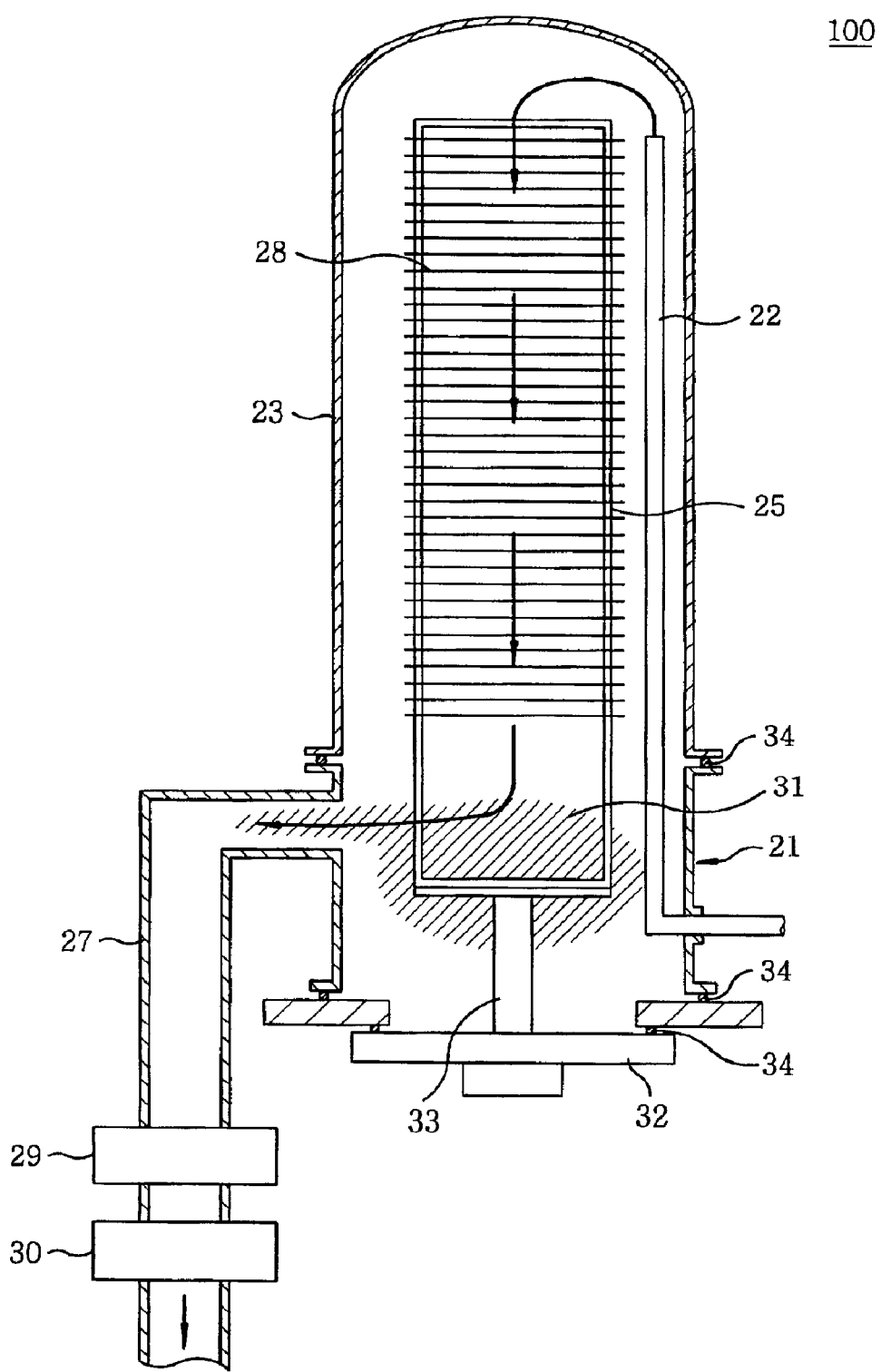
FIG. 5 describes a schematic front cross sectional view of a vertical type apparatus for use in manufacturing a semiconductor device in accordance with the present invention.

Referring to FIG. 5, there is shown a schematic cross sectional view of a vertical type apparatus 100 for use in manufacturing a semiconductor device in accordance with a second preferred embodiment of the present invention.

As shown, the apparatus 100 includes a base portion 21 having an open bottom at its lower part, a sealing cap 32 for closing the bottom of the base portion 21, a boat rotating mechanism 33 installed, e.g., at a central portion of the sealing cap 32 for rotating a standard boat 25, a reaction tube 23 having an open bottom, and O-rings 34 for sealing the apparatus 100 at the lower region of the base portion 21. The base portion 21 is provided with a gas supply conduit 22 for supplying gases to the reaction chamber 100. The gas supply conduit 22 extends to top portion of the reaction tube 23 such that, when the standard boat 25 is loaded into the reaction tube 23, the gases supplied therefrom flow downstream from an uppermost Si wafer of Si wafers 28 mounted in the standard boat 25.

The base portion 21 is further provided with an exhaust conduit 27 for exhausting the gases from the apparatus 100. The exhaust conduit 27 is connected to a mechanical booster pump 29 and a dry pump 30. The mechanical booster pump 29 exhausts gas between the cylinder (not shown) and the rotor (not shown) thereof by using the fact that distance between the cylinder and the rotor is varied with time. The dry pump 30 is a mechanical pump not using oil.

The reaction tube 23 is installed on the base portion 21 such that its interior communicates with an interior of the base portion 21, and another O-rings 34 are interposed, e.g., between the base portion 21 and the reaction tube 23 to seal the apparatus 100.

In such a reaction chamber 100, an inner pressure of the reaction chamber 100 is firstly made to an operation pressure range of the mechanical booster pump 29 by operating the dry pump 30 and then made to a range from about 0.1 and 100 Pa by operating the mechanical booster pump 29.

The inventive semiconductor device fabricating method using the apparatus 100 shown in FIG. 5 will now be described in detail.

Firstly, a method for forming Si epitaxial growth films on the Si wafers 28 will now be described.

Referring to FIG. 5, a plurality of Si wafers 28 is mounted first in the standard boat 25, which is then loaded into the reaction tube 23 of the apparatus 100.

Next, $SiH_4$ as the film forming gas, $BCl_3$ as the doping gas, and $H_2$ as the carrier gas are supplied to the upper part of the reaction tube 23 via the gas supply conduit 22 and then are exhausted from the lower part of the reaction tube 23 via the exhaust conduit 27. In this case, $SiH_4$, $BCl_3$ and $H_2$ flow in the apparatus 100 on the condition that the film forming pressure is in a range from about 0.1 and 100 Pa, preferably from about 0.1 and 30 Pa, and more preferably from about 0.1 and 20 Pa, and the film forming temperature is in a range from about 400 to 700° C., preferably from about 500 to 650° C. Consequently, on the Si wafers 28 are formed the Si epitaxial growth films into which B is doped.

Secondly, a method for forming the SiGe epitaxial growth films on the Si wafers 28 will now be described.

As shown in FIG. 5, a plurality of Si wafers 28 is mounted first in the standard boat 25, which is then loaded into the reaction tube 23 of the apparatus 100.

Next, $SiH_4$ and $GeH_4$ as the film forming gas, $BCl_3$ as the doping gas, and $H_2$ as the carrier gas are supplied to the upper part of the reaction tube 23 via the gas supply conduit 22 and then are exhausted from the lower part of the reaction tube 23 via the exhaust conduit 27. In this case, $SiH_4$, $GeH_4$, $BCl_3$ and $H_2$ flow in the apparatus 100 on the condition that the film forming pressure is in a range from about 0.1 and 100 Pa, preferably from about 0.1 and 50 Pa, and more preferably from about 0.1 and 30 Pa, and the film forming temperature is in a range from about 400 to 700° C. preferably from about 450 to 600° C. As a result, on the Si wafers 28 are formed the SiGe epitaxial growth films into which B is doped.

Such a semiconductor device manufacturing method may be also employed in the vertical type low pressure CVD apparatus shown in FIG. 1 to have a similar effect.

In such a semiconductor device fabricating method using the vertical type CVD apparatus as shown in FIG. 5, since the reaction tube 23 is disposed above the base portion 21, in which the contaminating source such as the sealing cap 32, the boat rotating mechanism 33 or the O-rings 34 is disposed, and the reaction gases and the carrier gas are supplied from the sealed top portion of the reaction tube 23 by using the gas supply conduit 22, it is possible for the high purity reaction gases and the carrier gas to reach the respective Si wafers 8 without being contaminated. Further, since contaminants in a contamination region 31 originated from the contamination source of the base portion 21 are pushed downwards by down-flowing the reaction gases and the carrier gas, the contaminants can be exhausted out through the exhaust conduit 27 without being introduced into the region where the Si wafers 8 are disposed. Therefore, it is possible to form the Si or the SiGe epitaxial growth films having a good quality on the Si wafers.

Although the above discussions refer to a situation where the inventive semiconductor device fabricating method is used in the vertical type low pressure CVD apparatus, the inventive method may be also adopted in the horizontal type low pressure CVD apparatus. Further, the ring boats may be also used in the present invention as well. Moreover, the Si and the SiGe epitaxial growth films can be formed on other type of substrate than Si wafers.

While the present invention has been described with respect to certain preferred embodiments only, other modifications and variations may be made without departing from the scope of the present invention as set forth in the following claims.

What is claimed is:

1. A method for fabricating a semiconductor device which comprises a boron doped epitaxial film on a wafer, said method comprising:

heating one or more wafers in a reaction chamber;

forming the film by supplying at least $SiH_4$, $BCl_3$ and a carrier gas to the reaction chamber and maintaining said chamber under conditions to produce the boron doped epitaxial film on said one or more wafers, said condition including a film forming pressure in the reaction chamber which ranges from about 0.1 to about 100 Pa a film forming temperature ranges from about 400 to 700° C.

2. A method for fabricating a semiconductor device comprising a boron doped epitaxial film on each of at least one wafer, comprising:

heating said at least one wafer in a reaction chamber; and forming the film by supplying at least $SiH_4$, $BCl_3$ and a carrier gas to the reaction chamber, wherein a film forming pressure in the reaction chamber ranges from about 0.1 to about 100 Pa a film forming temperature ranges from about 400 to 700° C. wherein $GeH_4$ is supplied to the reaction chamber together with $SiH_4$.

3. The method of claim 1, wherein the film forming pressure ranges from about 0.1 to 30 Pa.

4. The method of claim 3, wherein the film forming pressure ranges from about 0.1 to 20 Pa.

5. The method of claim 1, wherein the film forming temperature ranges from about 500 to 650° C.

6. The method of claim 2, wherein the film forming pressure ranges from about 0.1 to 50 Pa.

7. The method of claim 2, wherein the film forming pressure ranges from about 0.1 to 30 Pa.

8. The method of claim 2, wherein the film forming temperature ranges from about 450 to 600° C.

9. The method of claim 1, the carrier gas is $H_2$.

10. The method of claim 2, the carrier gas is $H_2$.

* * * * *